United States Patent
Barron et al.

(10) Patent No.: US 9,788,460 B2
(45) Date of Patent: Oct. 10, 2017

(54) HEATSINK PROVIDING EQUIVALENT COOLING FOR MULTIPLE IN-LINE MODULES

(71) Applicant: INTERNATIONAL BUSINESS MACHINES CORPORATION, Armonk, NY (US)

(72) Inventors: David Barron, Austin, TX (US); Ethan E. Cruz, Lagrangeville, NY (US); Howard V. Mahaney, Jr., Cedar Park, TX (US); Phillip V. Mann, Rochester, MN (US); Matthew T. Richardson, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/956,440

(22) Filed: Dec. 2, 2015

(65) Prior Publication Data
US 2017/0164520 A1    Jun. 8, 2017

(51) Int. Cl.
*H05K 7/20* (2006.01)
*H05K 1/02* (2006.01)
*G06F 1/20* (2006.01)

(52) U.S. Cl.
CPC ......... *H05K 7/20509* (2013.01); *G06F 1/206* (2013.01); *H05K 1/0203* (2013.01); *H05K 2201/064* (2013.01); *H05K 2201/066* (2013.01)

(58) Field of Classification Search
CPC ............. H05K 7/20509; H05K 1/0203; H05K 2201/064; H05K 2201/066; G06F 1/206; G06F 1/20; G06F 1/203

USPC ...................................... 165/104.33
See application file for complete search history.

(56) References Cited

U.S. PATENT DOCUMENTS

| | | | | |
|---|---|---|---|---|
| 4,839,774 A | * | 6/1989 | Hamburgen | H01L 23/467 257/E23.099 |
| 5,940,267 A | * | 8/1999 | Katsui | G06F 1/20 165/80.3 |
| 5,986,887 A | * | 11/1999 | Smith | H05K 7/20509 165/185 |
| 6,215,662 B1 | * | 4/2001 | Peter | H01L 23/3672 165/104.33 |
| 6,233,960 B1 | * | 5/2001 | Kang | H01L 23/445 257/E23.096 |
| 6,392,704 B1 | * | 5/2002 | Garcia-Ortiz | G08B 13/19619 340/937 |
| 6,888,725 B2 | * | 5/2005 | Kubo | G06F 1/20 257/721 |
| 7,111,667 B2 | * | 9/2006 | Chang | H01L 23/367 165/104.33 |
| 7,907,411 B2 | | 3/2011 | Whittum et al. | |

(Continued)

FOREIGN PATENT DOCUMENTS

WO    2015121069 A1    8/2015

*Primary Examiner* — David M Sinclair
*Assistant Examiner* — Robert Brown
(74) *Attorney, Agent, or Firm* — Law Office of Jim Boice

(57) ABSTRACT

A heatsink structure cools a first electronic chip and a second electronic chip that are positioned serially and in-line to one or more cooling fan, such that cooling air from the cooling fan(s) passes above the first electronic chip before passing above the second electronic chip. The heatsink structure includes a first heatsink and a second heatsink, which are identical to each other, and which fit adjacent to one another when a first heatsink is rotated 180 degrees relative to the second heatsink.

17 Claims, 5 Drawing Sheets

(56) References Cited

U.S. PATENT DOCUMENTS

| | | | |
|---|---|---|---|
| 7,990,704 B2* | 8/2011 | Cheng | H01L 23/467 165/104.33 |
| 8,109,321 B2* | 2/2012 | Alousi | F28D 15/0233 165/104.21 |
| 8,385,066 B2* | 2/2013 | Chang | H05K 7/20727 165/121 |
| 9,059,146 B2* | 6/2015 | Inoue | G06F 1/20 |
| 2003/0128518 A1* | 7/2003 | Gaynes | H01L 23/3675 361/704 |
| 2005/0041391 A1* | 2/2005 | Wrycraft | H05K 7/20727 361/695 |
| 2006/0060328 A1* | 3/2006 | Ewes | H01L 23/427 165/80.2 |
| 2006/0087816 A1* | 4/2006 | Ewes | F28F 3/02 361/704 |
| 2007/0169919 A1* | 7/2007 | Deng | H01L 23/427 165/104.33 |
| 2008/0295993 A1* | 12/2008 | Chen | H01L 23/427 165/80.3 |
| 2010/0142142 A1* | 6/2010 | Riebel | G06F 1/20 361/679.47 |
| 2011/0149518 A1* | 6/2011 | Salamon | H05K 7/20454 361/704 |
| 2011/0286175 A1* | 11/2011 | Iyengar | G06F 1/20 361/679.47 |
| 2012/0063095 A1* | 3/2012 | Sinha | H01L 21/563 361/714 |
| 2013/0168068 A1* | 7/2013 | Huang | H01L 23/36 165/168 |
| 2013/0269920 A1* | 10/2013 | Taketomi | F28F 3/02 165/185 |
| 2013/0340981 A1 | 12/2013 | Jewell-Larsen et al. | |
| 2015/0043167 A1* | 2/2015 | Guenin | H01L 23/3672 361/719 |
| 2015/0111480 A1* | 4/2015 | Vanko | B25F 5/008 451/359 |
| 2015/0181746 A1* | 6/2015 | Mullen | G06F 1/183 361/679.31 |
| 2015/0212555 A1* | 7/2015 | Cox | H01L 23/427 361/679.52 |
| 2015/0285573 A1* | 10/2015 | Stellman | F28F 13/00 361/679.54 |
| 2015/0366105 A1* | 12/2015 | Dunwoody | H05K 7/20509 165/76 |
| 2016/0106001 A1* | 4/2016 | Wanha | G06F 1/20 165/80.4 |
| 2016/0363968 A1* | 12/2016 | Schubert | G06F 1/20 |

* cited by examiner

HEATSINK PROVIDING EQUIVALENT COOLING FOR MULTIPLE IN-LINE MODULES

BACKGROUND

The present disclosure relates to the field of electronic circuits, and specifically to cooling devices used in electronic circuits. Still more specifically, the present invention relates to heatsinks used as cooling devices in electronic circuits

SUMMARY

A heatsink structure cools a first electronic chip and a second electronic chip that are positioned serially and in-line to cooling fan(s), where cooling air from the cooling fan(s) passes above the first electronic chip before passing above the second electronic chip. The heatsink structure includes a first heatsink and a second heatsink. The first heatsink is positioned over the first electronic chip and has a specific geometric shape. The second heatsink is positioned over the second electronic chip and has the same geometric shape as the first heatsink. The second heatsink is rotated 180 degrees relative to the first heatsink and pairs together with the first heatsink to form the heatsink structure. The first heatsink and the second heatsink are oriented lateral to each other and orthogonal to the cooling air flow direction such that cooling air from the cooling fan(s) passes across the second heatsink without passing through some or all of the first heatsink.

In an embodiment of the present invention, a circuit board includes the heatsink structure described above.

In an embodiment of the present invention, a computing device includes a cooling fan(s) and a circuit board that includes the heatsink structure described above.

DETAILED DESCRIPTION

Figure 1:
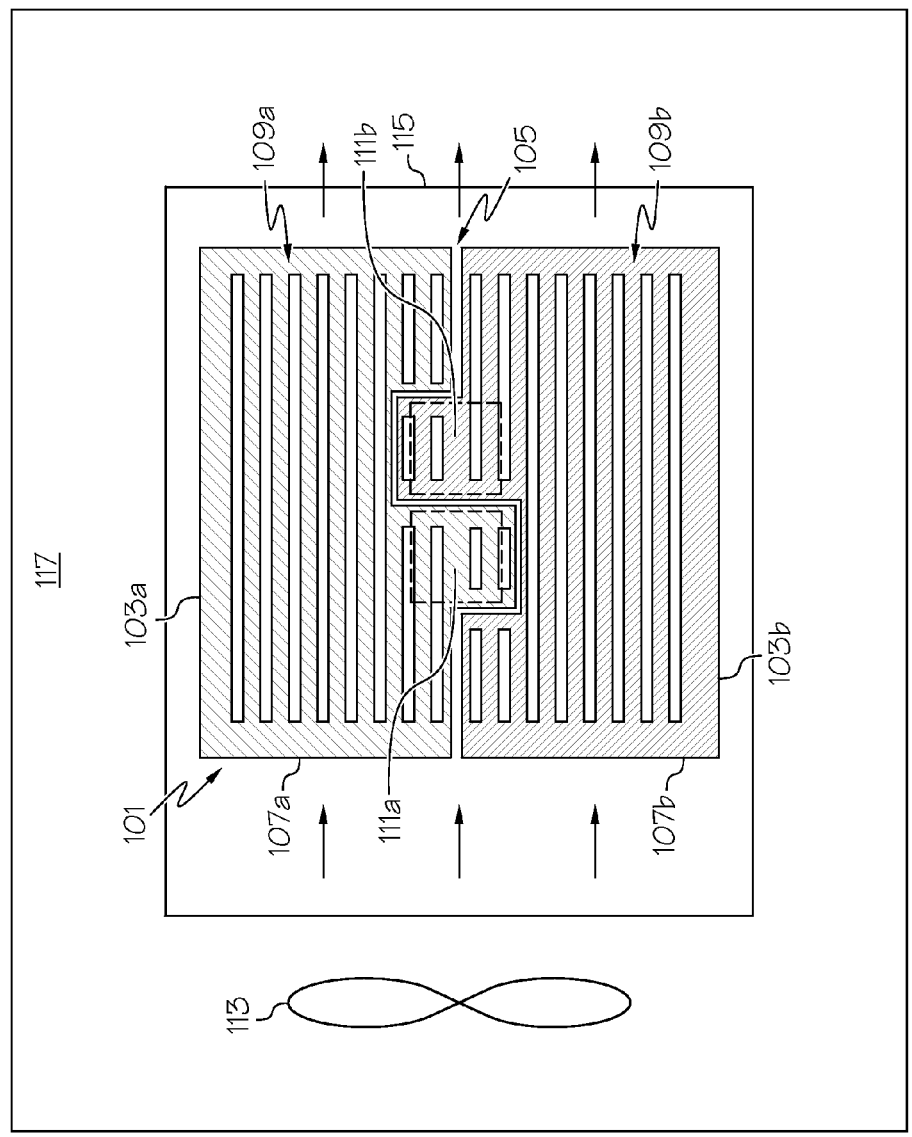
FIG. 1 depicts an exemplary computing device into which a novel heatsink is incorporated.

The present invention addresses a problem that arises when two electronic components (e.g., integrated circuit (IC) chips such as central processing units (CPUs), graphics processing units (GPUs), etc.) are aligned in series respective to a cooling fan(s). That is, assume that two chips are mounted on a printed circuit board (PCB), and that each of the chips has a finned heatsink mounted on top. Assume further that the two chips are oriented such that the second chip is downstream (downwind) of the first chip, such that the second finned heatsink above the second chip gets air that has been warmed by the first finned heatsink that is above the first chip. Since sufficient cooling must be provided to keep both chips at or below their thermal specification, the fan speed must be increased to keep the second chip within its thermal specification, and as a result provides significant overcooling to the first chip. This overcooling comes at the cost of increased fan speed, increased fan acoustics, increased fan power consumption, and decreased fan reliability.

The amount of preheating from an upwind heatsink is significant. For example, assume that air is receiving bulk heating from a 300 W heat source (i.e., a first module). If 25 CFM of air flows through a first (upwind) heatsink and it picks up 300 W of heat, the air will be ~22° C. warmer coming out of the first heatsink. This causes a second (downwind) heatsink and its associated module to be 22° C. warmer than the first module. This temperature difference is regardless of the heatsink technology employed (i.e., material choice, heat spreader, heatpipes, etc.).

One solution in the prior art to this problem was to simply install different types of heatsinks on the first and second chips (modules) described above. For example, the first finned heatsink on top of the first chip described above may have smaller and/or fewer fins than the second finned heatsink. This lowers the overall flow impedance of the path, allowing the fan to operate at a lower pressure drop/higher flowrate point on a fan curve. By removing fins on the first heatsink, the temperature of the first heatsink increases, while the added airflow decreases the temperature to the second heatsink, such that the first and second chips can be cooled to roughly the same temperature. However, this requires different types of finned heatsinks to be installed on the PCB, which is more expensive than using a same type of finned heatsink on both chips. Furthermore, if the module and heatsink are stocked as a pre-assembled pair, then upstream and downstream pairs must be stocked worldwide, instead of just a single assembly if the same heatsink is used upstream and downstream.

Having two types of finned heatsinks also creates the risk of installing the two finned heatsinks in the reverse orientation, such that the first chip gets the more efficient finned heatsink and the second chip gets the less efficient finned heatsink. This results in the first chip running very cool, while the second (downwind) chip overheats.

Thus, the present invention provides heatsinks that are geometrically identical (and thus cannot be incorrectly installed on the PCB), and yet still provide the same amount of cooling to both in-line modules.

With reference now to FIG. 1, an exemplary computing device into which a novel heatsink is incorporated is presented.

As shown in FIG. 1, the (two-part) heatsink structure 101 is made up of a first heatsink 103a and a second heatsink 103b. As depicted in FIG. 1, the first heatsink 103a and the second heatsink 103b are geometrically identical, but second heatsink 103b has been rotated 180 degrees relative to the first heatsink 103a, such that the first heatsink 103a and the second heatsink 103b nest together to form the complete heatsink structure 101. In one embodiment, there is an air gap 105 between the first heatsink 103a and the second heatsink 103b when nested together, such that there is no direct contact (and thus no metal-to-metal heat transference) between the first heatsink 103a and the second heatsink 103b. In a preferred embodiment, air gap 105 is through a mid height of the depicted modules.

The first heatsink 103a has a first heatsink base 107a (e.g., a plate of metal, which may include heat transfer structures such as heatpipes, vapor chambers, etc.). Mounted atop first heatsink base 107a is a first set of heat radiating fins 109a, which dissipates heat away from first heatsink base 107a.

The second heatsink 103b has a second heatsink base 107b. Mounted atop the second heatsink base 107b is a second set of heat radiating fins 109b, which dissipates heat away from second heatsink base 107b.

Fins may span the entire left-to-right expanse of the heatsink, or may start and stop somewhat before the left and right edges of the heatsink (as depicted in FIG. 1).

First and second heatsinks 103a-103b, including first and second heatsink bases 107a-107b and first and second sets of heat radiating fins 109a-109b, are constructed of any heat conducting material.

The first heatsink 103a is mounted atop a first electronic chip 111a (e.g., a central processing unit—CPU, a graphics processing unit—GPU, a network interface card (NIC), etc.). More specifically, a set of securing hardware (not shown) holds the first heatsink 103a securely against a Thermal Interface Material (TIM) that is atop the first electronic chip 111a. Similarly, a second heatsink 103b is mounted atop a second electronic chip 111b, which may be a same type of chip or a different type of electronic chip than first electronic chip 111a.

As shown in FIG. 1, the heatsink structure 101 may be utilized on a circuit board 115, such as a PCB. Furthermore, the circuit board 115 may be part of a computing device 117 (e.g., a server, a desktop computer, a laptop computer, a smart phone, etc.) that includes cooling fan(s) 113 or another air moving device, such as blowers.

As shown in FIG. 1, the first heatsink 103a and the second heatsink 103b are oriented lateral to each other and orthogonal to the cooling fan flow direction 113, such that cooling air from the cooling fan(s) 113 passes across the second heatsink 103b without passing through some or all of the first heatsink 103a.

Figure 2:
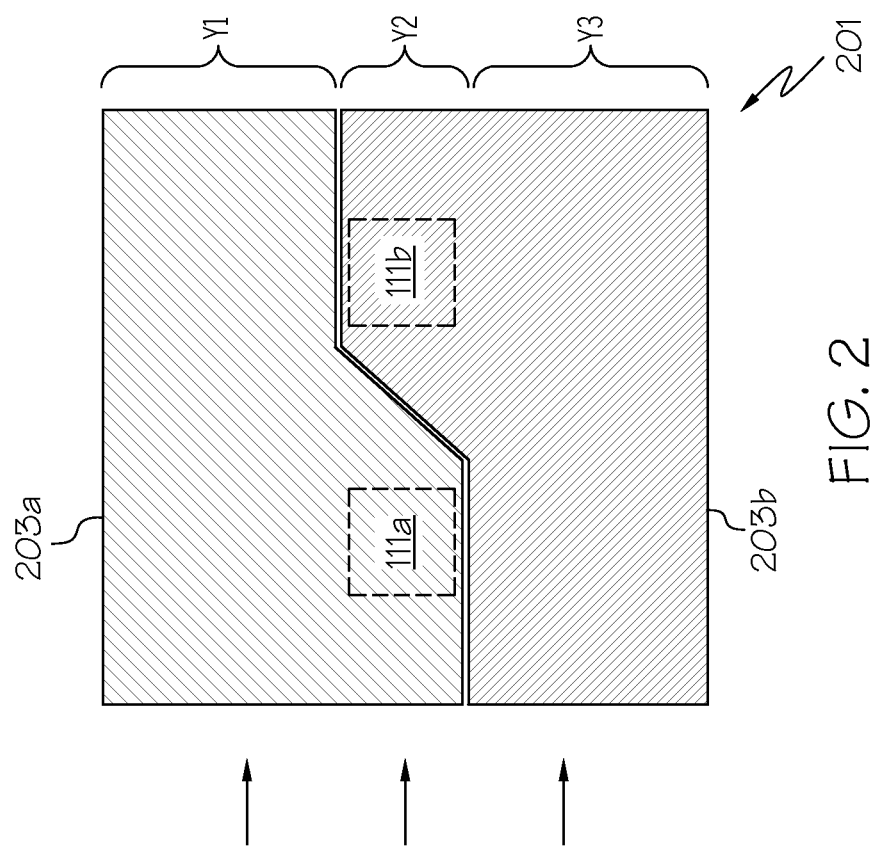
FIG. 2 illustrates an alternative embodiment of the novel heatsink depicted in FIG. 1.

With reference now to FIG. 2, an alternative embodiment of the novel heatsink depicted in FIG. 1 is presented as heatsink structure 201 where electronic chips 111a and 111b are spaced farther apart. For purposes of clarity, the first and second sets of heat radiating fins 109a-109b and the cooling fan(s) 113 depicted in FIG. 1 are not shown in FIG. 2, but should be assumed to still exist in the embodiment depicted in FIG. 2.

As shown in FIG. 2, the first heatsink 203a and the second heatsink 203b (similar to the first and second heatsinks 103a-103b described in FIG. 1) are identical in shape. However, the first heatsink 203a is rotated 180 degrees relative to the second heatsink 203b, such that the first and second heatsinks nest together to form heatsink structure 201.

In FIG. 2, the first heatsink 203a is mounted atop the first electronic chip 111a, and the second heatsink 203b is mounted atop the second electronic chip 111b.

Although not shown, other embodiments of the shape of the heatsink between the electronics chips 111a and 111b are possible, wherein the heatsinks 203a and 203b are of the same shape. For instance, one possibility is that the angled shape is eliminated. Here heatsink 203a covers the left half of the region between the chips and heatsink 203b covers the right half of the region between the chips. Alternatively, heatsink 203a could cover the top half of the region between the chips, while heatsink 203b could cover the bottom half of the region between the chips. Other configurations are also possible.

As depicted in FIG. 2, the portion of the first heatsink 203a within the range depicted as Y1 completely receives fresh and identical cooling to that which passes over the second heatsink 203b within the range depicted as Y3. However, the portion of the first heatsink 203a within the range Y2 receives fresh air, whereas the portion of the second heatsink 203b within the range Y2 receives preheated air. When Y1 and Y3 are large compared to Y2 (e.g., Y1 has an area that is at least twice that of Y2 and Y3 also has an area that is at least twice that of Y2), the effect of preheating that occurs in range Y2 is small.

Figure 3:
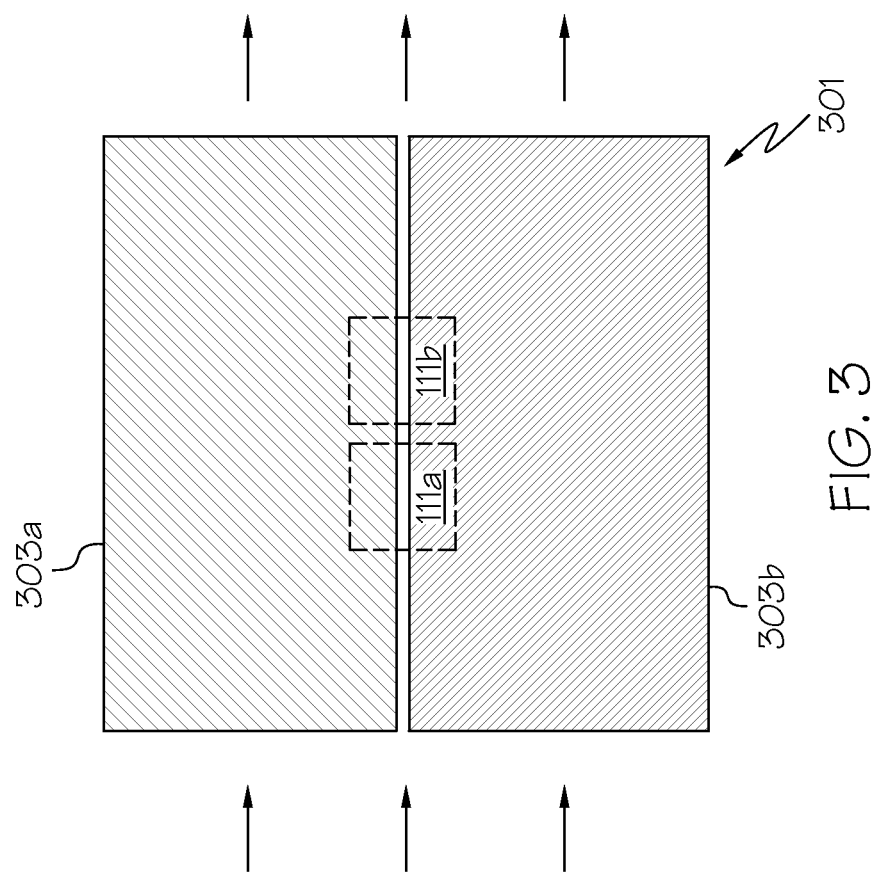
FIG. 3 depicts another alternative embodiment of the novel heatsink depicted in FIG. 1.

As shown in FIG. 3, heatsink structure 301 includes the first heatsink 303a that cools the first electronic chip 111a. Similarly, the second heatsink 303b cools the second electronic chip 111b. In a preferred embodiment, however, additional structure is used to thermally interface the depicted heatsinks with the electronic chips.

Figure 4:
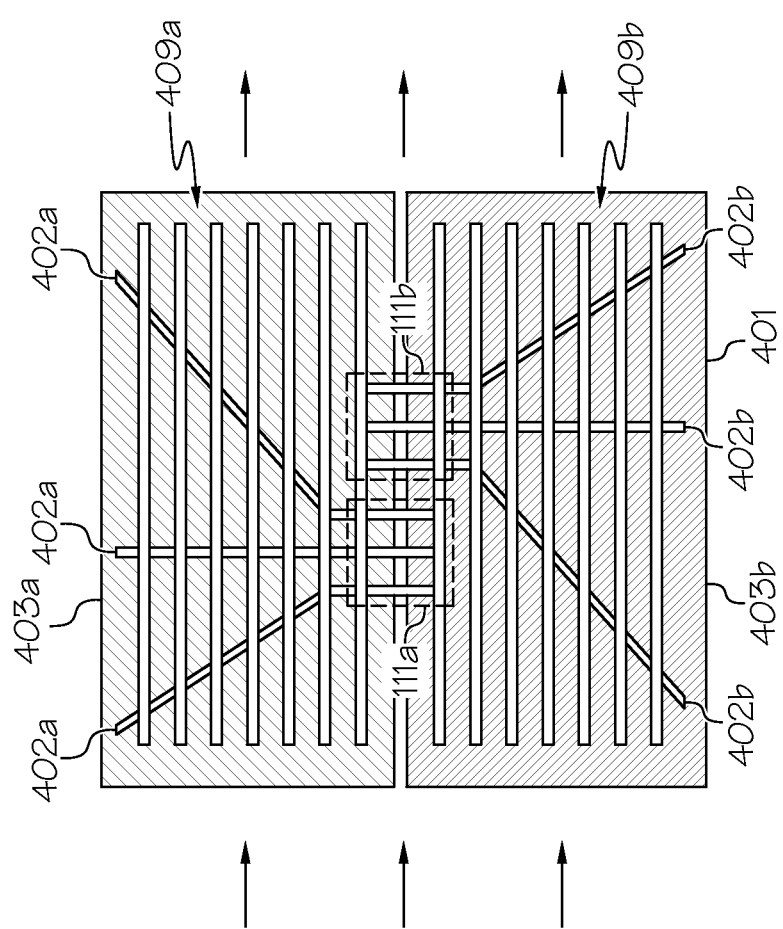
FIG. 4 depicts exemplary details of the novel heatsink depicted in FIG. 3 into which heatpipes are incorporated.

With reference now to FIG. 4, further details of the embodiment of FIG. 3 is shown which depicts a heatsink structure 401, which incorporates the use of a thermal enhanced structure such as a set of heatpipes. A first set of heat radiating fins 409a is mounted atop a first heatsink base, which includes a first set of heatpipes 402a on the first heatsink 403a, and a second set of heat radiating fins 409b are mounted atop a second heatsink base which includes a second set of heatpipes 402b on the second heatsink 403b. As depicted, first heatsink 403a and second heatsink 403b have the same physical structure/shape (e.g., are identical to one another) but are rotated 180 degrees relative to one another.

As shown in FIG. 4, the first set of heatpipes 402a is part of the first heatsink 403a (which is devoted to cooling the first electronic chip 111a). Similarly, the second set of heatpipes 402b is part of the second heatsink 403b (which is devoted to cooling the second electronic chip 111b). These depicted heatpipes transfer heat from their respective electronic chips 111a/111b. Due to the fact that cool air from the cooling fan(s) passes across the heatpipes and/or their associated heat radiating fins at the same rate and temperature in both the first heatsink 403a and the second heatsink 403b, the heat removal rate and/or efficacy of the first heatsink 403a and the second heatsink 403b is the same.

In one or more embodiments of the present invention, the first set of heatpipes 402a extends beyond the perimeter of heatsink 403a and the second set of heatpipes 402b extends beyond the perimeter of heatsink 403b.

Figure 5:
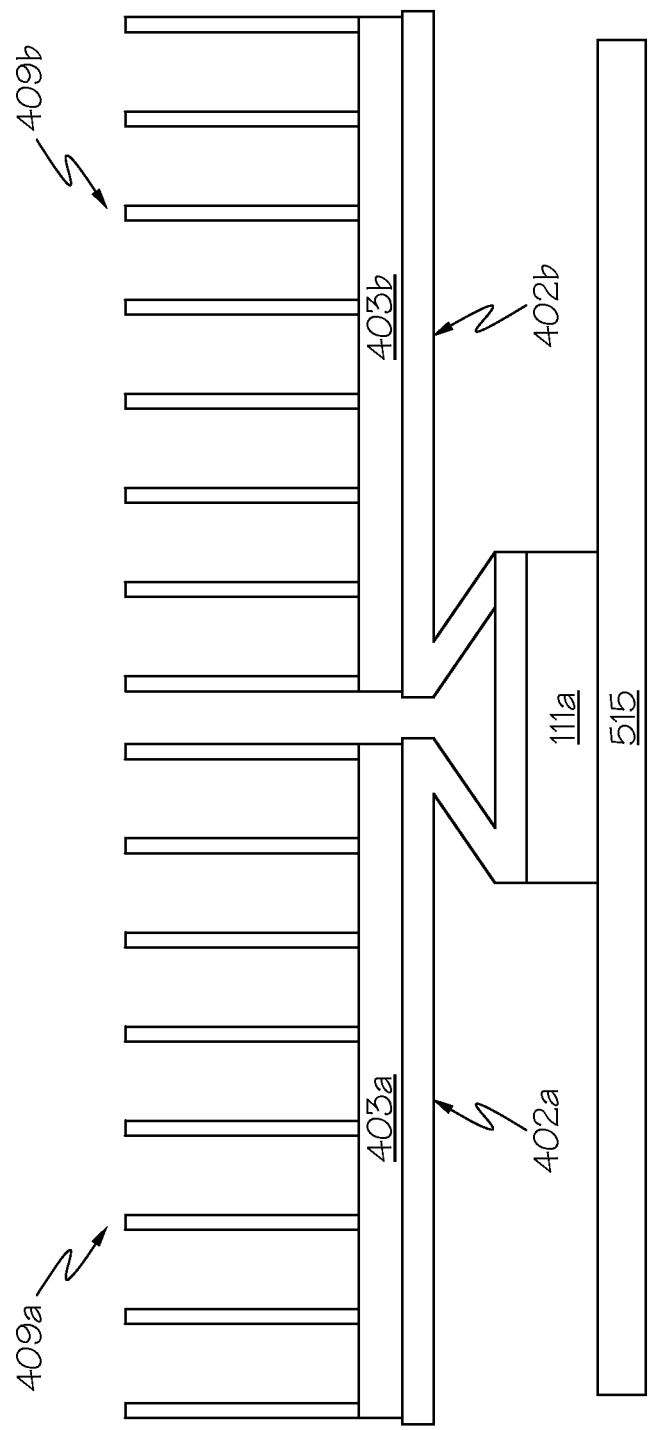
FIG. 5 depicts exemplary detail of the heatsinks depicted in FIG. 4.

With reference now to FIG. 5, exemplary detail of first heatsink 403a and second heatsink 403b shown in FIG. 4 is presented in a front view. Depicted above the first electronic chip 111a from FIG. 4 is the first set of heatpipes 402a (also shown in FIG. 4), including the front-most heatpipe to be visible from the front view. The first set of heatpipes 402a is an integral part of first heatsink 403a (also shown in FIG. 4), thus allowing heat to be transferred from the first electronic chip 111a to the first set of heat radiating fins 409a in first heatsink 403a via heatpipe 402a.

Similarly, a second set of heatpipes 402b (including the visible front-most heatpipe from the second set of heatpipes 402b), which is positioned above the second electronic chip 111b, carries heat from the second electronic chip 111b to the second set of heat radiating fins 409b in second heatsink 403b.

Note that FIG. 5 is intended as a schematic depiction of the heatpipes. As such, additional mechanical support (not shown) for the first heatsink 403a and/or the second heatsink 403b heat sink to the module (e.g., first electronic chip 111a and/or second electronic chip 111b) or the printed circuit board (card) upon which such modules are mounted may be provided.

The first and second sets of heatpipes 402a/402b utilize heatpipes which each include a casing, which is an integral part of heatsinks. Within each casing is a wick, which holds a fluid, in either liquid form or as a vapor.

Thus, as first electronic chip 111a generates heat, one end of heatpipes from the first set of heatpipes 402a are also heated, which causes fluid within the casing to transition from a liquid to a vapor. After the fluid turned into a vapor (and thus absorbed thermal energy), it is expelled into from the wick and transferred to the end of the heatpipes from the first set of heatpipes 402a that are distal to the first electronic chip 111a. The vapor then cools condenses back into a liquid at the low temperature end of the heatpipes in the first set of heatpipes 402a. This liquid then migrates back along the wick until it seeps back into the cavity that is near the first electronic chip. The process of vaporizing the liquid in the heatpipes in the first set of heatpipes 402a back into a vapor to remove heat from the first electronic chip 111a then repeats in a continuous manner to remove heat from the first electronic chip 111a. The second set of heatpipes 402 performs the same function for the second electronic chip 111b.

In one embodiment of the present invention, the first set of heatpipes 402a is brazed to the bottom of the first heatsink 403a, and the second set of heatpipes 402b is brazed to the bottom of the second heatsink 403b.

In one embodiment of the present invention, the first set of heatpipes 402a is embedded into the internal structure of the first heatsink 403a and the second set of heatpipes 402b is embedded into the internal structure of the second heatsink 403b.

As described herein in various embodiments, a novel heatsink structure cools a first electronic chip and a second electronic chip that are positioned serially and in-line to a cooling fan(s) by utilizing a first heatsink and a second heatsink that provide equivalent, or nearly equivalent, levels of cooling capacity.

Having thus described embodiments of the present invention of the present application in detail and by reference to illustrative embodiments thereof, it will be apparent that modifications and variations are possible without departing from the scope of the present invention defined in the appended claims.

What is claimed is:

1. A heatsink structure for cooling a first electronic chip and a second electronic chip that are positioned serially and in-line to one or more cooling fans, wherein cooling air from the one or more cooling fans passes above the first electronic chip before passing above the second electronic chip, and wherein the heatsink structure comprises:
   a first heatsink positioned over the first electronic chip, wherein the first heatsink has a geometric shape, a size, and a first set of heat radiating fins; and
   a second heatsink positioned over the second electronic chip, wherein the second heatsink has the geometric shape and size of the first heatsink, wherein the second heatsink has a second set of heat radiating fins having a same geometric shape and size as the first set of heat radiating fins, wherein the second heatsink is rotated 180 degrees relative to the first heatsink and fits adjacent to the first heatsink to form the heatsink structure, wherein a portion of the first set of heat radiating fins is interposed within the second set of heat radiating fins, wherein a portion of the second set of heat radiating fins is interposed within the first set of heat radiating fins, and wherein the first heatsink and the second heatsink are oriented to a cooling air flow direction such that cooling air from the one or more cooling fans that passes across the portion of the first set of heat radiating fins does not pass across the portion of the second set of heat radiating fins.

2. The heatsink structure of claim 1, wherein an area of the first heatsink that is positioned over the first electronic chip is less than one half of a total area of the first heatsink, and wherein an area of the second heatsink that is positioned over the second electronic chip is less than one half of a total area of the second heatsink.

3. The heatsink structure of claim 1, further comprising:
   a thermally enhanced structure affixed to the first heatsink; and
   a thermally enhanced structure affixed to the second heatsink.

4. The heatsink structure of claim 3, wherein the thermally enhanced structure affixed to the first heatsink is a first set of heatpipes, and wherein the thermally enhanced structure affixed to the second heatsink is a second set of heatpipes.

5. The heatsink structure of claim 1, wherein the portion of the first set of heat radiating fins is interposed within a first area of the second heat sink and a second area of the second heat sink, wherein the portion of the second set of heat radiating fins is interposed within a first area of the first heat sink and a second area of the first heat sink, wherein the cooling air passes sequentially through the first area of the first heat sink followed by the portion of the second set of heat radiating fins followed by the second area of the first heat sink, and wherein the cooling air passes sequentially through the first area of the second heat sink followed by the portion of the first set of heat radiating fins followed by the second area of the second heat sink.

6. A circuit board comprising:
   a heatsink structure for cooling a first electronic chip and a second electronic chip that are positioned serially and in-line to one or more cooling fans, wherein cooling air from the one or more cooling fans passes above the first electronic chip before passing above the second electronic chip, and wherein the heatsink structure comprises:
      a first heatsink positioned over the first electronic chip, wherein the first heatsink has a geometric shape, a size, and a first set of heat radiating fins; and
      a second heatsink positioned over the second electronic chip, wherein the second heatsink has the geometric shape and size of the first heatsink, wherein the second heatsink has a second set of heat radiating fins having a same geometric shape and size as the first set of heat radiating fins, wherein the second heatsink is rotated 180 degrees relative to the first heatsink and fits adjacent to the first heatsink to form the heatsink structure, wherein a portion of the first set of heat radiating fins is interposed within the second set of heat radiating fins, wherein a portion of the second set of heat radiating fins is interposed within the first set of heat radiating fins, and wherein the first heatsink and the second heatsink are oriented to a cooling air flow direction such that cooling air from the one or more cooling fans that passes across the portion of the first set of heat radiating fins does not pass across the portion of the second set of heat radiating fins.

7. The circuit board of claim 6, wherein an area of the first heatsink that is positioned over the first electronic chip is less than one half of a total area of the first heatsink, and wherein an area of the second heatsink that is positioned over the second electronic chip is less than one half of a total area of the second heatsink.

8. The circuit board of claim 6, further comprising:
a thermally enhanced structure affixed to the first heatsink; and
a thermally enhanced structure affixed to the second heatsink.

9. The circuit board of claim 6, wherein the portion of the first set of heat radiating fins is interposed within a first area of the second heat sink and a second area of the second heat sink, wherein the portion of the second set of heat radiating fins is interposed within a first area of the first heat sink and a second area of the first heat sink, wherein the cooling air passes sequentially through the first area of the first heat sink followed by the portion of the second set of heat radiating fins followed by the second area of the first heat sink, and wherein the cooling air passes sequentially through the first area of the second heat sink followed by the portion of the first set of heat radiating fins followed by the second area of the second heat sink.

10. The circuit board of claim 8, wherein the thermally enhanced structure affixed to the first heatsink is a first set of heatpipes, and wherein the thermally enhanced structure affixed to the second heatsink is a second set of heatpipes.

11. A computing device comprising:
an air moving device;
a circuit board; and
a heatsink structure for cooling a first electronic chip and a second electronic chip that are positioned serially and in-line to the air moving device, wherein cooling air from the air moving device passes above the first electronic chip before passing above the second electronic chip, and wherein the heatsink structure comprises:
a first heatsink positioned over the first electronic chip, wherein the first heatsink has a geometric shape, a size, and a first set of heat radiating fins; and
a second heatsink positioned over the second electronic chip, wherein the second heatsink has the geometric shape and size of the first heatsink, wherein the second heatsink has a second set of heat radiating fins having a same geometric shape and size as the first set of heat radiating fins, wherein the second heatsink is rotated 180 degrees relative to the first heatsink and fits adjacent to the first heatsink to form the heatsink structure, wherein a portion of the first set of heat radiating fins is interposed within the second set of heat radiating fins, wherein a portion of the second set of heat radiating fins is interposed within the first set of heat radiating fins, and wherein the first heatsink and the second heatsink are oriented to a cooling air flow direction such that cooling air from the one or more cooling fans that passes across the portion of the first set of heat radiating fins does not pass across the portion of the second set of heat radiating fins.

12. The computing device of claim 11, wherein an area of the first heatsink that is positioned over the first electronic chip is less than one half of a total area of the first heatsink, and wherein an area of the second heatsink that is positioned over the second electronic chip is less than one half of a total area of the second heatsink.

13. The computing device of claim 11, further comprising:
a thermally enhanced structure affixed to the first heatsink; and
a thermally enhanced structure affixed to the second heatsink.

14. The computing device of claim 13, wherein the thermally enhanced structure affixed to the first heatsink is a first set of heatpipes, and wherein the thermally enhanced structure affixed to the second heatsink is a second set of heatpipes.

15. The computing device of claim 11, wherein the air moving device is one or more fans.

16. The computing device of claim 11, wherein the air moving device is a blower.

17. The computing device of claim 11, wherein the portion of the first set of heat radiating fins is interposed within a first area of the second heat sink and a second area of the second heat sink, wherein the portion of the second set of heat radiating fins is interposed within a first area of the first heat sink and a second area of the first heat sink, wherein the cooling air passes sequentially through the first area of the first heat sink followed by the portion of the second set of heat radiating fins followed by the second area of the first heat sink, and wherein the cooling air passes sequentially through the first area of the second heat sink followed by the portion of the first set of heat radiating fins followed by the second area of the second heat sink.

* * * * *